(12) United States Patent
Nakasha et al.

(10) Patent No.: US 8,948,299 B2
(45) Date of Patent: Feb. 3, 2015

(54) PULSE CONVERTING AND SHAPING COMMUNICATION DEVICE

(71) Applicant: Fujitsu Limited, Kawasaki (JP)

(72) Inventors: Yasuhiro Nakasha, Hadano (JP); Hiroki Hayashi, Yokohama (JP); Takumi Itoh, Sakura (JP)

(73) Assignee: Fujitsu Limited, Kawasaki (JP)

( * ) Notice: Subject to any disclaimer, the term of this patent is extended or adjusted under 35 U.S.C. 154(b) by 156 days.

(21) Appl. No.: 13/687,746

(22) Filed: Nov. 28, 2012

(65) Prior Publication Data
US 2013/0195216 A1    Aug. 1, 2013

(30) Foreign Application Priority Data

Jan. 26, 2012    (JP) .................... 2012-014324

(51) Int. Cl.
| | | |
|---|---|---|
| H04L 25/03 | (2006.01) | |
| H04B 1/717 | (2011.01) | |
| H04B 1/7163 | (2011.01) | |
| H03M 5/16 | (2006.01) | |
| H03K 5/12 | (2006.01) | |
| H03K 5/01 | (2006.01) | |

(52) U.S. Cl.
CPC ............ *H04L 25/03* (2013.01); *H04B 1/71635* (2013.01); *H04B 1/7172* (2013.01); *H04B 1/7174* (2013.01); *H03M 5/16* (2013.01); *H03K 5/12* (2013.01)
USPC ........... 375/296; 375/256; 327/166; 327/165; 398/188; 398/183; 398/182

(58) Field of Classification Search
CPC ........... H03K 2005/00215; H03K 5/12; H04L 25/03834; H04B 10/508; H04B 1/7174; H01S 3/0057
USPC .......... 375/256, 295; 327/173, 172, 100, 335, 327/334; 398/189, 183, 182
See application file for complete search history.

(56) References Cited

U.S. PATENT DOCUMENTS 3,636,545 A * 1/1972 Boyd et al. .................... 702/147
4,736,242 A * 4/1988 Takanashi et al. ............ 348/285

(Continued)

FOREIGN PATENT DOCUMENTS

| EP | 2555440 A1 | 2/2013 |
|---|---|---|
| JP | 3-027622 | 2/1991 |

(Continued)

OTHER PUBLICATIONS

IEEE Standard Test Procedures for Germanium Gamma-Ray Detectors, IEEE Std 325-1996, section 3.1.51, 1997.*
IEEE Standards for Local and Metropolitan Area Networks: Supplement to Integrated Services (IS) LAN Interface at the Medium Access Control (MAC) and Physical (PHY) Layers: Specification of IsLAN16-T, IEEE Std 802.9a-1995, section 3.28, 1996.*

(Continued)

*Primary Examiner* — Chieh M Fan
*Assistant Examiner* — Michelle M Koeth
(74) *Attorney, Agent, or Firm* — Fujitsu Patent Center

(57) ABSTRACT

A communication device includes: a converting part converting a data signal from a non-return-to-zero signal to a return-to-zero signal; a trigger flip-flop inverting an output signal every time the return-to-zero signal changes in one cycle; a first filter outputting a positive pulse and a negative pulse alternately, which indicate existence and absence of the pulse corresponding to a value of the data signal, by removing a low frequency component of an output signal of the trigger flip-flop.

9 Claims, 9 Drawing Sheets

(56) References Cited

U.S. PATENT DOCUMENTS

| | | | |
|---|---|---|---|
| 7,242,262 B2 | 7/2007 | Kawano | |
| 8,054,908 B2 | 11/2011 | Nakasha et al. | |
| 8,643,405 B2 * | 2/2014 | Moore et al. | 327/108 |
| 2002/0196508 A1 * | 12/2002 | Wei et al. | 359/183 |
| 2008/0198939 A1 * | 8/2008 | Nakasha et al. | 375/256 |
| 2010/0013520 A1 * | 1/2010 | Ayraud | 327/98 |

FOREIGN PATENT DOCUMENTS

| | | |
|---|---|---|
| JP | 2006-157649 | 6/2006 |
| JP | 2008-205717 A | 9/2008 |

OTHER PUBLICATIONS

Kawano, Yoichi et al., "An RF Chipset for Impulse Radio UWB Using 0.13 μm InP-HEMT Technology," Microwave Symposium Digest, IEEE, MIT-S International, Jun. 11, 2006, pp. 316-319, XP031507247.

Kawano, Yoichi et al., "RF Chipset for Impulse UWB Radar Using 0.13-μm InP-HEMT Technology," IEEE Transactions of Microwave Theory and Techniques, Dec. 1, 2006, vol. 54, No. 12, Dec. 1, 2006, pp. 4489-4497, XP011151487.

Extended European Application No. 12195027.3 for corresponding European Application No. 12195027.3.

* cited by examiner

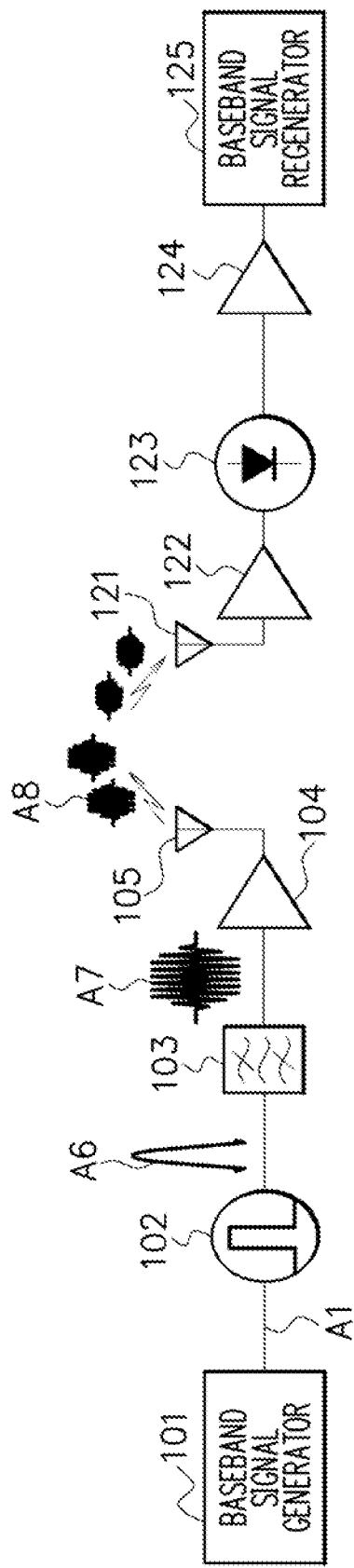
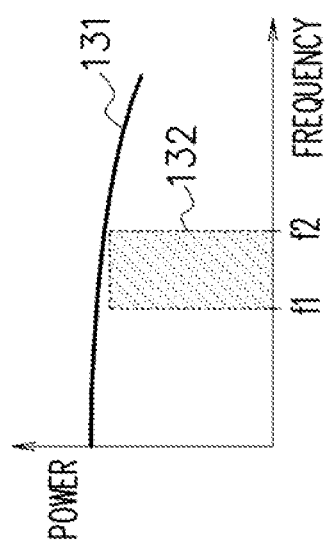
FIG. 1A
FIG. 1B

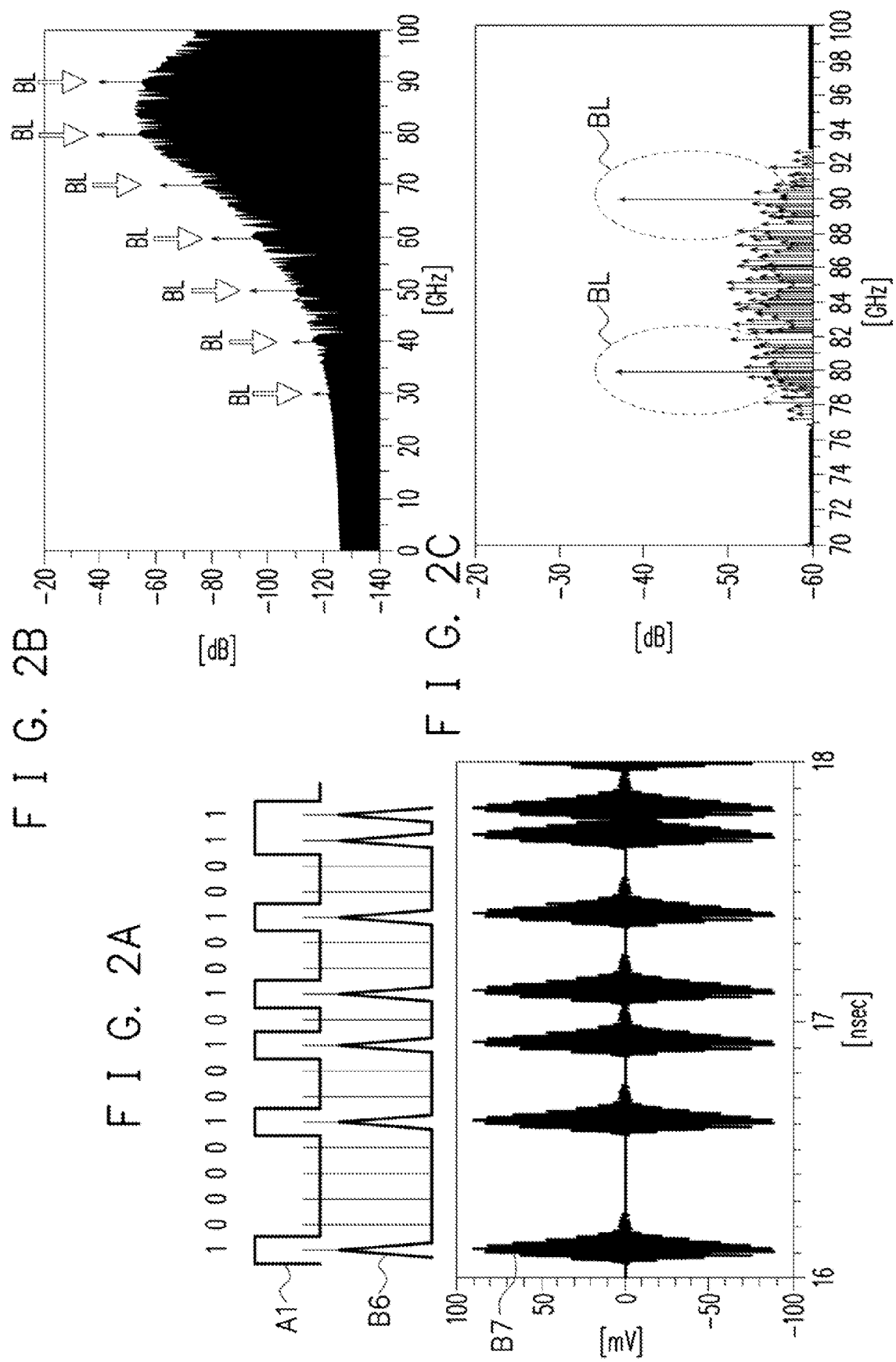

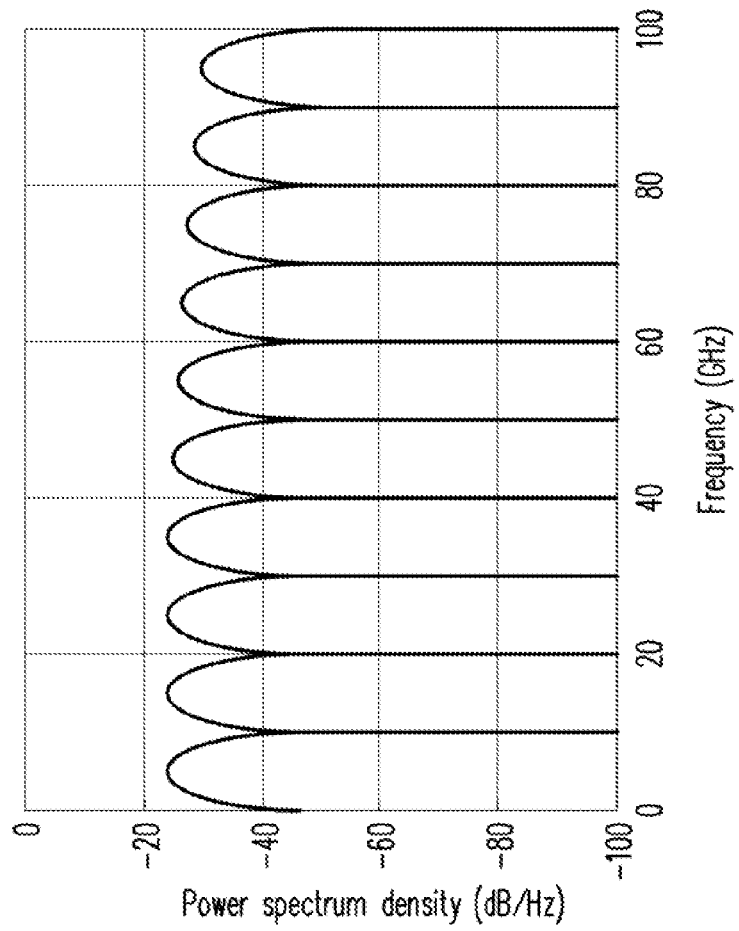
F I G. 4A
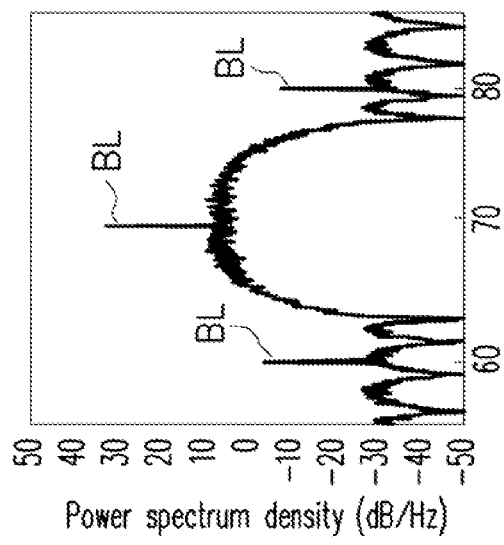
F I G. 4B
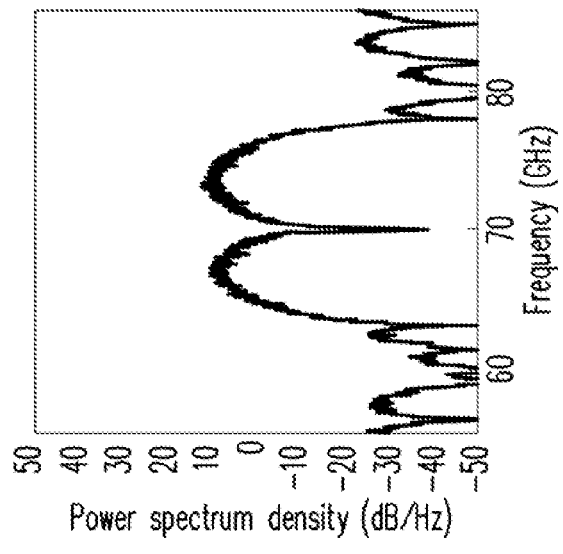
F I G. 4C

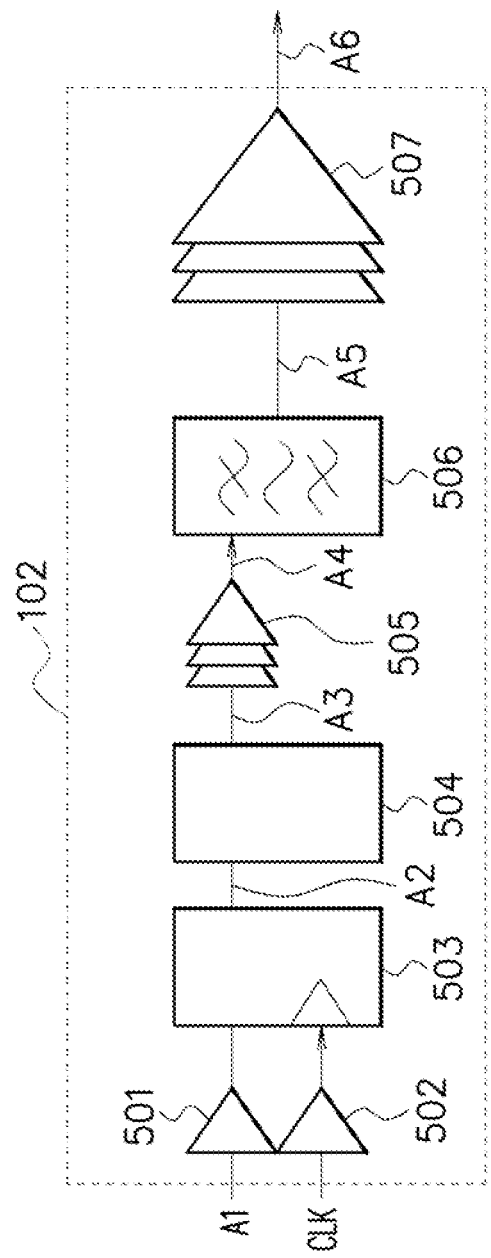

F I G. 6
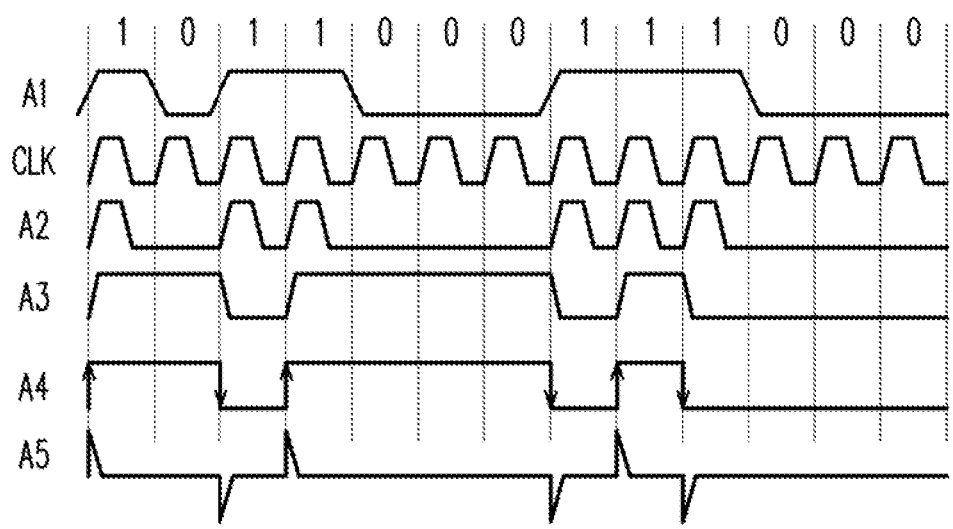

US 8,948,299 B2

PULSE CONVERTING AND SHAPING COMMUNICATION DEVICE

CROSS-REFERENCE TO RELATED APPLICATION

This application is based upon and claims the benefit of priority of the prior Japanese Patent Application No. 2012-014324, filed on Jan. 26, 2012, the entire contents of which are incorporated herein by reference.

FIELD

The embodiments discussed herein are directed to a communication device.

BACKGROUND

Impulse radio communication is radio communication using a short pulse and its application to a wide band radio communication system is expected.

Meanwhile, there is known a U/B conversion circuit, which is a U/B (Unipolar/Bipolar) conversion circuit converting a unipolar signal into a bipolar signal and which obtains a bipolar signal converted from an NRZ (Non Return to Zero) signal for an emitter output of a transistor when an input NRZ signal subjected to NRZ/RZ (Non Return to Zero/Return to Zero) conversion is given (for example, see Patent Document 1).

Further, there is known a pulse polarity modulation circuit in which a differential transistor pair is vertically stacked in two stages and which converts a unipolar pulse into a bipolar pulse in correspondence with a value of input data (for example, see Patent Document 2).

Patent Document 1: Japanese Laid-open Patent Publication No. 3-027622

Patent Document 2: Japanese Laid-open Patent Publication No. 2006-157649

SUMMARY

A communication device includes: a converting part converting a data signal from a non-return-to-zero signal into a return-to-zero signal; a trigger flip-flop inverting an output signal every time the return-to-zero signal changes in one cycle; a first filter outputting a positive pulse and a negative pulse alternately, which indicate existence and absence of the pulse corresponding to a value of the data signal, by removing a low frequency component of an output signal of the trigger flip-flop.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1A is a diagram depicting a configuration example of an impulse radio communication device according to a first embodiment, and FIG. 1B is a diagram depicting a pass frequency band of a band-pass filter;

FIG. 2A to FIG. 2C are diagrams depicting examples in which a short-pulse generating part generates a unipolar short pulse;

FIG. 4A to FIG. 4C are diagrams depicting power spectral densities of the unipolar short pulse and the bipolar short pulse;

FIG. 5 is a diagram depicting a configuration example of the short-pulse generating part of FIG. 1A;

FIG. 6 is a timing chart for explaining an operation example of the short-pulse generating part of FIG. 5;

DESCRIPTION OF EMBODIMENTS

First Embodiment

Figure 3:
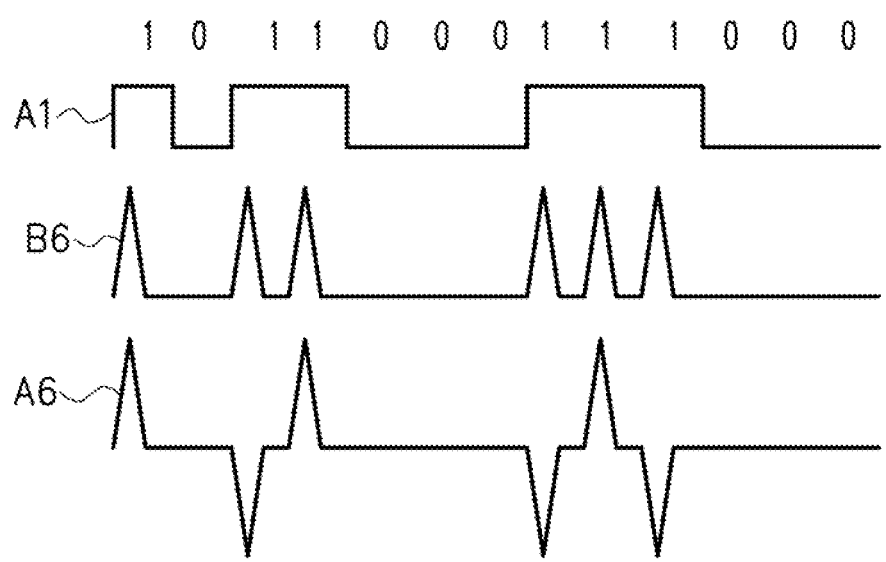
FIG. 3 is a diagram depicting an example of a unipolar short pulse and a bipolar short pulse.

FIG. 1A is a diagram depicting a configuration example of an impulse radio communication device according to a first embodiment, and FIG. 1B is a diagram depicting a pass frequency band of a band-pass filter 103. The impulse radio communication device has a baseband signal generator 101, a short pulse generating part 102, a band-pass filter 103, a transmitting amplifier 104, a first antenna 105, a second antenna 121, a receiving amplifier 122, a wave detector 123, a limit amplifier 124, and a baseband signal regenerator 125. The baseband signal generator 101, the short pulse generating part 102, the band-pass filter 103, the transmitting amplifier 104, and the first antenna 105 constitute a transmitting section. In contrast, the second antenna 121, the receiving amplifier 122, the wave detector 123, the limit amplifier 124, and the baseband signal regenerator 125 constitute a receiving section.

First, the transmitting section will be described. The baseband signal generator 101 generates a data signal A1 of a time slot unit and outputs the data signal A1 to the short pulse generating part 102. As depicted in FIG. 6, the data signal A1 is at a a high level with a value "1" and is at a low level with a value "0". A communication speed of the data signal A1 is, for example, 10 gigabit/second (Gbps). The short pulse generating part 102 generates a short pulse A6 when the data signal A1 is at the high level in a time slot. The band-pass filter 103 performs filtering, on the short pulse A6, for letting only a predetermined pass frequency band pass, and outputs a millimeter wave pulse A7.

FIG. 1B depicts a pass frequency band 132 of the band-pass filter 103. A short pulse characteristic 131 indicates a frequency characteristic of the short pulse A6. The millimeter wave pulse A7 has a frequency component of only a portion of the pass frequency band 132 among the short pulse characteristic 131. In a UWB (Ultra Wide Band) or the like, usable frequency band is limited. In order to satisfy the limit of the frequency band, the band-pass filter 103 is used. The pass frequency band 132 has, for example, a pass lower limit frequency f1 of 80 GHz and a pass higher limit frequency f2 of 90 GHz, and its pass frequency band width is f2−f1=90−80=10 GHz.

The transmitting amplifier 104 amplifies the millimeter wave pulse A7 and radio-transmits a transmission signal A8 via the first antenna 105. The transmission signal A8 indicates data of "1" or "0" in correspondence with existence/absence of a millimeter pulse.

Next, the receiving section will be described. The receiving amplifier 122 radio-receives a reception signal via the second antenna 121, and amplifies the reception signal. The wave detector 123 detects and outputs an envelope of the reception signal (millimeter pulse) amplified by the receiving amplifier 122. The limit amplifier 124 amplifies the signal detected by the wave detector 123. The baseband signal regenerator 125 inputs a signal amplified by the limit amplifier 124 and performs regeneration of reception data of, for example, 10 Gbps.

The impulse radio communication device is usable in an ultra-wide band radio communication device such as for a microwave band, a sub-millimeter wave band, and a UWB. An impulse system has a feature that an oscillator and a mixer is unnecessary, leading to a simple and low-cost configuration of an RF section in comparison with a narrow band communication system, and realization of wide band radio communication exceeding 10 Gbps is expected in a millimeter wave band in which a wide band can be used.

When a frequency band width allotted to the impulse radio communication device is Bmax, a maximum communication speed Bmax is attained at a time that the pass frequency band width Bbpf of the band-pass filter 103 is equal to Bmax. For example, when the frequency band width Bmax is 10 GHz, as depicted in FIG. 1B, the pass frequency band width Bbpf of the band-pass filter 103 is f2−f1=90−80=10 GHz, and a communication speed of the data signal is 10 Gbps.

FIG. 2A is a diagram depicting an example in which the short pulse generating part 102 generates a unipolar short pulse B6. The short pulse generating part 102 generates a positive short pulse in a time slot where the data signal A1 is at the high level, and does not generates the positive short pulse in a time slot where the data signal A1 is at the low level, outputting the unipolar short pulse B6. The unipolar short pulse B6 is a short pulse of a single polarity (for example, positive polarity). The band-pass filter 103 filters the unipolar short pulse B6, and outputs a millimeter wave pulse B7. For example, the millimeter wave pulse B7 has a communication speed of 10 Gbps and a time slot of 100 ps.

FIG. 2B is a diagram depicting a frequency spectrum of the millimeter pulse B7 of FIG. 2A, and FIG. 2C is an enlarged diagram of a part of FIG. 2B. When the communication speed of the millimeter pulse B7 is 10 Gbps, bright-line spectra BL are generated at an interval of 10 GHz. The bright-line spectra BL are linear spectra of large power, and are generated at 30, 40, 50, 60, 70, 80, 90 GHz and so on, for example. The bright-line spectra BL appear at a frequency interval equal to a communication speed. For example, the bright-line spectra BL appear at an interval of 10 GHz, when the communication speed is 10 Gbps.

Meanwhile, many radio communication devices are speculated in terms of a signal strength (power spectral density) per a unit frequency by law, a standard or the like, such as, a signal strength 0 dBm (=1 mW/MHz) per a frequency 1 MHz, for example. When the bright-line spectrum BL is included in the transmission signal, the signal strength of the bright-line spectrum BL is limited by limitation of the above-described power spectral density, leading to occurrence of a situation where an average power in the entire frequency band cannot be raised. More specifically, when the allotted frequency band Bmax is 10 GHz (=10000 MHz), in a case that a transmitting spectrum strength is constant within a frequency band, output of 1 (mW/MHz)×10000 (MHz)=10 W becomes possible, but in a case that a bright-line spectrum BL of 1 mW/MHz is included in a transmission signal, only a small power can be outputted. In order to transmit a signal for a long distance without an error, it is necessary to maximize a spectrum power of the entire frequency band to secure a signal strength margin (SN ratio) against a noise or the like. When a transmitting power is limited due to the bright-line spectrum BL, a sufficient SN ratio cannot be secured. As described above, the transmitting power is limited due to the bright-line spectrum BL, disadvantaging long-distance and high-quality communication, and realization of an impulse radio communication device which does not generate a bright-line spectrum BL is a problem. Hereinafter, there is described an embodiment of an impulse radio communication device in which a transmission signal does not include a bright-line spectrum BL and which is suitable for long-distance and high-quality communication.

FIG. 3 is a diagram depicting examples of a unipolar short pulse B6 and a bipolar short pulse A6. The unipolar short pulse B6 is similar to the unipolar short pulse B6 of FIG. 2A. In the present embodiment, the short pulse generating part 102 inputs the data signal A1 and generates the bipolar short pulse A6. The bipolar short pulse A6 indicates existence/absence of a pulse corresponding to a value of the data signal A1 and is a pulse in which a positive pulse and a negative pulse are alternately generated. For example, in the bipolar short pulse A6, a positive pulse or a negative pulse is generated when the value of the data signal A1 is "1" and standard voltage is had when the value of the data signal A1 is "0". The positive pulse is a pulse of positive voltage in relation to the standard voltage, while the negative pulse is a pulse of negative voltage in relation to the standard voltage. In other words, the bipolar short pulse A6 is a pulse with a reverse polarity to the last pulse.

In the bipolar short pulse A6, a phase of a high frequency component is merely reversed from that in the unipolar short pulse B6, and an envelope of the signal is the same. The wave detector 123 of FIG. 1A detects only an envelope of a reception signal. Therefore, the configuration of the receiving section of the impulse radio communication device of FIG. 1A can be the same in a case of receiving the unipolar short pulse B6 and in a case of receiving the bipolar short pulse A6.

FIG. 4A is a diagram depicting a power spectral density of the bipolar short pulse A6. Here, a communication speed of a transmission signal is 10 Gbps and a time slot of the transmission signal is 100 ps. As regards the power spectral density of the bipolar short pulse A6, a notch is generated at a frequency equal to an integral multiple of the communication speed (10 Gbps). In other words, when k is an integer, a notch is generated at a frequency of k×10 GHz. The notch is a recessed part in which the power spectral density is small.

FIG. 4B is a diagram depicting a power spectral density of an output signal of the band-pass filter 103 into which the unipolar short pulse B6 is input. In the case of the unipolar short pulse B6, similarly to in FIG. 2B and FIG. 2C, a bright-line spectrum BL is generated at a frequency equal to an integral multiple of the communication speed (10 Gbps). For example, the bright-line spectra are generated at 60 GHz, 70 GHz, and 80 GHz.

FIG. 4C is a diagram depicting a power spectral density of an output signal A7 of the band-pass filter 103 into which the bipolar short pulse A6 is inputted. In the case of the bipolar short pulse A6, similarly to FIG. 4A, a notch is generated at a frequency equal to an integral multiple of the communication speed (10 Gbps). For example, notches are generated at 60 GHz, 70 GHz, and 80 GHz. As a result, the bright-line spectrum BL at the frequency equal to the integral multiple of the communication speed (10 Gbps) is removed. According to the present embodiment, since the bright-line spectrum BL is not generated, securing of transmitting power is facilitated, which is advantageous for performing long-distance and high-quality communication. Further, by setting a communication speed appropriate for an allotted frequency band, notches can be disposed in both ends f1 and f2 of the pass frequency band of the band-pass filter 103, which is also advantageous for suppressing radiation of an unnecessary radio wave to outside the allotted frequency band.

A transmitting speed of the data signal is set to be one-integerth of a difference between a pass upper limit frequency f2 and a pass lower limit frequency f1 of the band-pass filter 103. For example, the upper limit frequency f2 is 90 GHz and the lower limit frequency f1 is 80 GHz. The pass frequency band width of the band-pass filter 103 is f2−f1=90−80=10 GHz. In this case, the transmitting speed of the data signal is set to be one-integerth of 10 GHz. For example, the transmitting speed of the data signal can be set to be 10 Gbps, 5 Gbps, 2 Gbps, 1 Gbps, or the like. By setting the transmitting speed as above, notches can be disposed in the both ends f1 and f2 of the pass frequency band of the band-pass filter 103, so that it is possible to suppress radiation of an unnecessary radio wave to outside the allotted frequency band. Note that as the transmitting speed is made small, a frequency interval of notches becomes short, resulting in the increased number of notches.

FIG. 5 is a diagram depicting a configuration example of the short pulse generating part 102 of FIG. 1A, and FIG. 6 is a timing chart for explaining an operation example of the short pulse generating part 102 of FIG. 5. The short pulse generating part 102 has input buffers 501, 502, a non-return-to-zero (NRZ)/return-to-zero (RZ) converting part 503, a trigger flip-flop (T-FF) 504, an edge shaping circuit 505, a first filter 506, and a first amplifier 507. A data signal A1 is a non-return-to-zero signal. The input buffer 501 buffers the non-return-to-zero signal A1, and the input buffer 502 buffers a clock signal CLK. The non-return-to-zero/return-to-zero converting part 503 converts the non-return-to-zero signal A1 into a return-to zero-signal A2. More specifically, the non-return-to-zero/return-to-zero converting part 503 is a logical multiplication (AND) circuit, and obtains a logical multiplication of the non-return-to-zero signal A1 and the clock signal CLK, outputting a logical multiplication signal thereof as the return-to-zero signal A2. The trigger flip-flop 504 inverts an output signal A3 every time the return-to-zero signal A2 changes in one cycle. For example, every time the return-to-zero signal A2 changes in one cycle as from a high level to a low level and to the high level, a logic level of the output signal A3 is inverted. More specifically, the output signal A3 is logic-inverted in synchronicity with a rising edge of the return-to-zero signal A2. The edge shaping circuit 505 steepens a rising edge and a falling edge of the output signal A3 of the trigger flip-flop 504 and outputs a signal A4 to the first filter 506. The signal A4 is a signal whose rising time and falling time are short and which has a spectrum to a higher frequency. The first filter 506 is a high-pass filter or a band-pass filter, and by removing a low frequency component of the output signal A4 of the edge shaping circuit 505, outputs a signal A5 which indicates existence/absence of a pulse corresponding to a value of the data signal A1 and in which a positive pulse and a negative pulse are alternately generated. As the high-pass filter, for example, a serially connected capacitor element can be used. The first amplifier 507 is a wide band amplifier or a distributed amplifier, and amplifies the output signal A5 of the first filter 506 and outputs an amplified signal A6 to the band-pass filter 103 of FIG. 1A.

Note that if an edge of a signal is sufficiently steep the edge shaping circuit 505 can be eliminated. Further, if a size of a signal is sufficient, the first amplifier 507 can be eliminated.

Figure 7A:
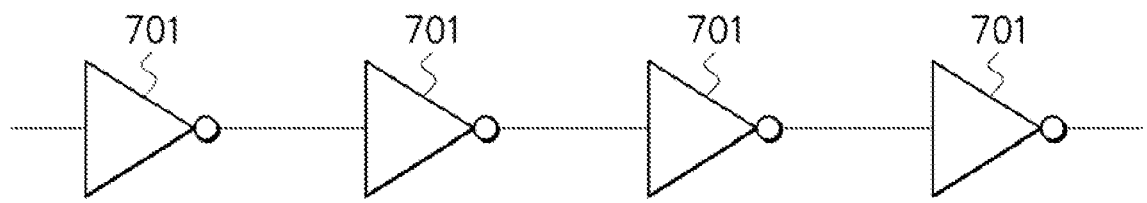
FIG. 7A and FIG. 7B are diagrams depicting configuration examples of an edge shaping circuit of FIG. 5A.

FIG. 7A is a diagram depicting a configuration example of the edge shaping circuit 505 of FIG. 5. The edge shaping circuit 505 has a serially connected circuit of an even number of inverters 701, and is capable of steepening an edge of an input signal and outputting.

Figure 7B:
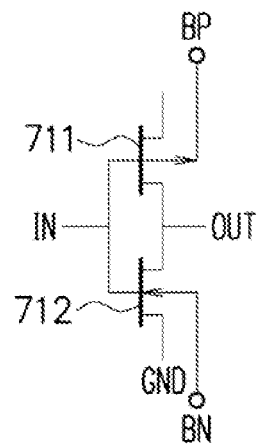

FIG. 7B is a circuit diagram depicting a configuration example of the inverter 701 of FIG. 7A. The inverter 701 has a p-channel field effect transistor 711 and an n-channel field effect transistor 712, and inverts a signal of an input node IN, outputting the inverted signal to an output node OUT. In the p-channel field effect transistor 711, a source is connected to a power source potential node VDD, a gate is connected to the input node IN, a drain is connected to the output node OUT, and a back gate is connected to a back gate voltage terminal BP. In the n-channel field effect transistor 712, a source is connected to a ground potential node GND, a gate is connected to the input node IN, a drain is connected to the output node OUT, and a back gate is connected to a back gate voltage terminal BN. Usually, a power source potential of the power source potential node VDD is applied to the back gate voltage terminal BP, and a ground potential of the ground potential node GND is applied to the back gate voltage terminal BN. Here, by a difference of current values or gate widths of the transistors 711 and 712, duty ratios sometimes deviate from 50%. Thus, to the back gate voltage terminals BP and BN, variable back gate voltage is applied in order to adjust a duty ratio of a signal to be 50%. By adjusting the back gate voltage, the duty ratio of the signal can be made 50%.

Figure 8:
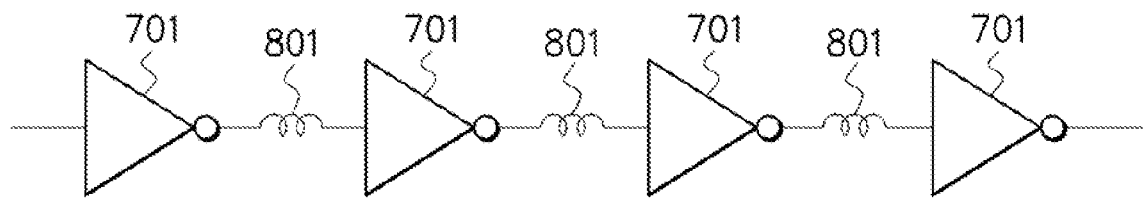
FIG. 8 is a diagram depicting another configuration example of the edge shaping circuit of FIG. 5.

FIG. 8 is a diagram depicting another configuration example of the edge shaping circuit 505 of FIG. 5. The edge shaping circuit 505 has a serially connected circuit of even-number sets of inverters 701 and inductors 801, and is capable of steepening an edge of an input signal and outputting. As a result of providing the inductor 801 which gives peeking in the edge shaping circuit 505 of FIG. 7A, the edge shaping circuit 505 of FIG. 8 can make the edge of the signal steeper. Note that the inverter 701 has a configuration of FIG. 7B and has back gate voltage terminals BP and BN.

Figure 9A:
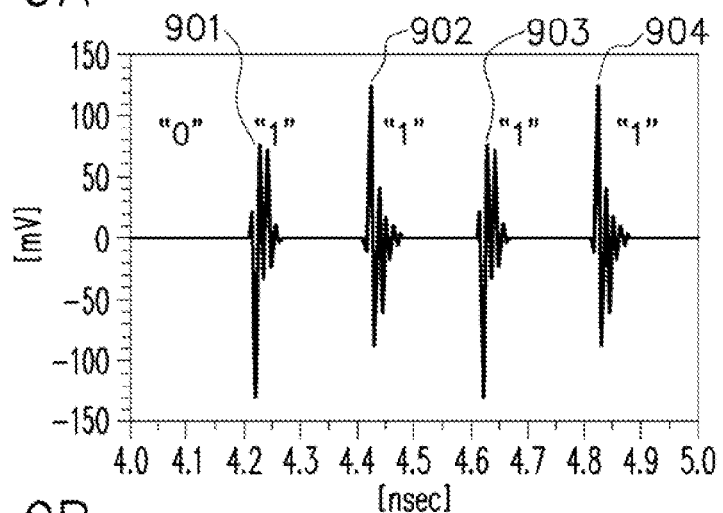
FIG. 9A is a diagram depicting a waveform of a bipolar short pulse generated by the short-pulse generating part of FIG. 5.
Figure 9B:
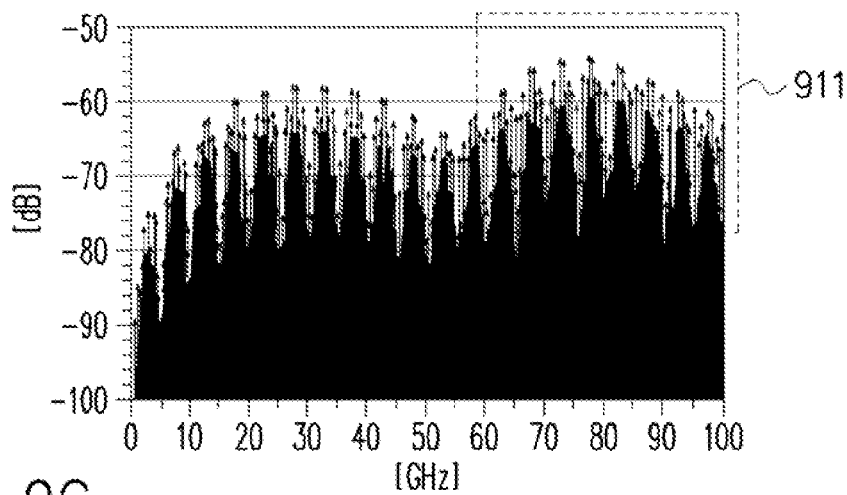
FIG. 9B is a diagram depicting a frequency spectrum of the bipolar short pulse of FIG. 9A.
Figure 9C:
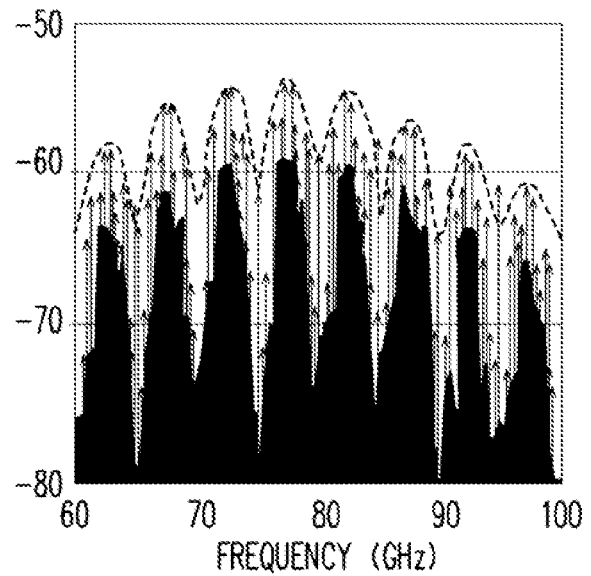
FIG. 9C is an enlarged diagram of a region of a part of the frequency spectrum of FIG. 9B.

FIG. 9A is a diagram depicting a waveform of a bipolar short pulse generated by the short pulse generating part 102 of FIG. 5, FIG. 9B is a diagram depicting a frequency spectrum of the bipolar short pulse of FIG. 9A, and FIG. 9C is an enlarged diagram of a region 911 of a part of the frequency spectrum of FIG. 9B. As depicted in FIG. 9A, for example, odd-numberth pulses 901 and 903 are positive pulses starting from rising, and even-numberth pulses 902 and 904 are negative pulses starting from falling. The positive pulse and the negative pulse occur alternately. The odd-numberth pulses 901, 903 and the even-numberth pulses 902, 904 are inverted to each other in terms of polarity (phase). Further, as depicted in FIG. 9B and FIG. 9C, it is learned that a bright-line spectrum on a frequency spectrum is removed.

According to the present embodiment, since a bright-line spectrum BL is not included in a transmission signal, a large transmitting power is secured and a large communication margin (S/N) can be obtained without receiving power limitation by the bright-line spectrum BL, so that there is an effect that long-distance and high-quality communication of a signal is facilitated. Further, by setting a communication speed appropriately to an allotted frequency band and disposing notches of spectrum on both ends of an allotted frequency band width, there is also an effect that unnecessary power radiation to outside the allotted frequency band is reduced. In a receiving section, a receiving section for receiving a bipolar short pulse A6 can have a configuration similar to that of a receiving section for receiving a unipolar short pulse B6, and thus, increase of an introduction cost can be suppressed to the minimum.

Second Embodiment

Figure 10:
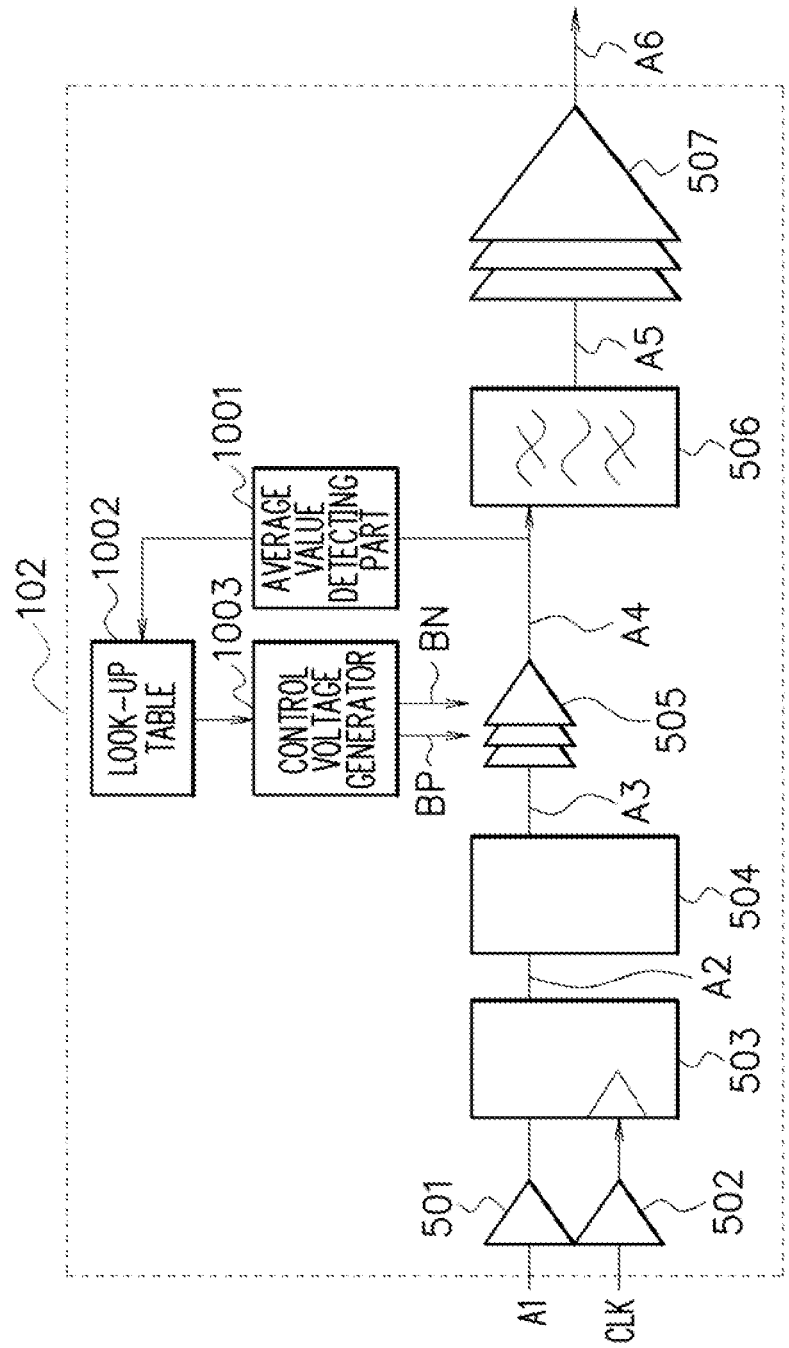
FIG. 10 is a diagram depicting a configuration example of a short-pulse generating part according to a second embodiment.

FIG. 10 is a diagram depicting a configuration example of a short pulse generating part 102 according to a second embodiment. The short pulse generating part 102 of FIG. 10 has an average value detecting part 1001, a look-up table 1002, and a control voltage generator 1003 added to the short pulse generating part 102 of FIG. 5. Hereinafter, points in which the present embodiment is different from the first embodiment will be described. A duty ratio of a signal changes in correspondence with environment such as a temperature. Thus, in the present embodiment, by automatically controlling the back gate voltage of the back gate voltage terminals BP and BN of FIG. 7B, the duty ratio of the signal is adjusted to be 50%.

The average value detecting part 1001 detects an average value of an output signal A4 of an edge shaping circuit 505. The look-up table 1002 outputs back gate voltage information to the control voltage generator 1003 in correspondence with the average value detected by the average value detecting part 1001. The control voltage generator 1003 generates back gate voltage in correspondence with the back gate voltage information, and outputs the back gate voltage to back gate voltage terminals BP and BN (FIG. 7B) of the edge shaping circuit 505. In other words, the control voltage generator 1003 generates the back gate voltage of the back gate voltage terminals BP and BN in correspondence with the average value of the output signal A4 of the edge shaping circuit 505. Thereby, in the edge shaping circuit 505, the duty ratio of the signal is adjusted to be 50%. According to the present embodiment, even if environment such as a temperature changes, a duty ratio of a signal can be controlled in real time.

By outputting a positive pulse and a negative pulse alternately, a bright-line spectrum in a signal can be removed.

It should be noted that the above embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A communication device comprising:
 a converting part that converts a data signal from a non-return-to-zero signal into a return-to-zero signal;
 a trigger flip-flop that inverts an output signal every time the return-to-zero signal changes in one cycle;
 a first filter that outputs a positive pulse and a negative pulse alternately, which indicate existence and absence of the pulse corresponding to a value of the data signal; and
 an edge shaping circuit that steepens an edge of the output signal of the trigger flip-flop circuit and outputs to the first filter,
 wherein the first filter removes a low frequency component of the output signal of the edge shaping circuit.

2. The communication device according to claim 1, wherein the edge shaping circuit has an inverter.

3. The communication device according to claim 2, wherein the edge shaping circuit has a serially connected circuit of the inverter and an inductor.

4. The communication device according to claim 2, wherein the inverter has a p-channel field effect transistor and an n-channel field effect transistor, and
 wherein the p-channel field effect transistor and the n-channel field effect transistor have back gate voltage terminals to apply variable back gate voltage to adjust a duty ratio of a signal.

5. The communication device according to claim 4, further comprising:
 a control voltage generator that generates the back gate voltage in correspondence with the output signal of the edge shaping circuit.

6. The communication device according to claim 5, wherein the control voltage generator generates the back gate voltage in correspondence with an average value of the output signals of the edge shaping circuit.

7. The communication device according to claim 1, further comprising:
 a first amplifier that amplifies the output signal of the first filter.

8. The communication device according to claim 1, further comprising:
 a band-pass filter that filters the output signal of the first filter.

9. The communication device according to claim 8, wherein a transmitting speed of the data signal is one-integerth of a difference between a pass upper limit frequency and a pass lower limit frequency of the band-pass filter.

* * * * *